United States Patent
Lin et al.

(10) Patent No.: US 10,389,302 B2
(45) Date of Patent: Aug. 20, 2019

(54) VOLTAGE-CONTROLLED OSCILLATOR

(71) Applicant: National Chi Nan University, Puli, Nantou (TW)

(72) Inventors: Yo-Sheng Lin, Nantou (TW); Jin-You Liao, Nantou (TW)

(73) Assignee: NATIONAL CHI NAN UNIVERSITY, Puli, Nantou (TW)

( * ) Notice: Subject to any disclaimer, the term of this patent is extended or adjusted under 35 U.S.C. 154(b) by 236 days.

(21) Appl. No.: 15/624,800

(22) Filed: Jun. 16, 2017

(65) Prior Publication Data

US 2018/0212567 A1 Jul. 26, 2018

(30) Foreign Application Priority Data

Jan. 20, 2017 (TW) .............................. 106102027 A (51) Int. Cl.
*H03B 5/12* (2006.01)

(52) U.S. Cl.
CPC ........... *H03B 5/1212* (2013.01); *H03B 5/129* (2013.01); *H03B 5/1221* (2013.01); *H03B 5/1228* (2013.01); *H03B 5/1243* (2013.01); *H03B 5/1293* (2013.01)

(58) Field of Classification Search
CPC .. H03B 5/1221; H03B 5/1228; H03B 5/1293; H03B 5/129; H03B 5/1243
USPC ................................ 331/117 FE, 167, 177 V
See application file for complete search history.

(56) References Cited

U.S. PATENT DOCUMENTS 7,683,681 B2 * 3/2010 Jang ....................... H03B 19/03
327/118

* cited by examiner

*Primary Examiner* — Arnold M Kinkead
(74) *Attorney, Agent, or Firm* — Merchant & Gould P.C.

(57) ABSTRACT

A voltage-controlled oscillator includes an oscillation generator, two inductors and two amplifiers. The oscillation generator generates two oscillation voltage signals based on a control voltage. Each inductor receives a respective oscillation voltage signal, and provides a respective input voltage signal. Each amplifier generates a respective current signal based on a respective input voltage signal. When one of the current signals has a magnitude that varies according to a magnitude of the respective input voltage signal, the other of the current signals has a constant magnitude. The current signals are combined into an output current signal at a common node of the amplifiers.

11 Claims, 7 Drawing Sheets

VOLTAGE-CONTROLLED OSCILLATOR

CROSS-REFERENCE TO RELATED APPLICATION

This application claims priority of Taiwanese Patent Application No. 106102027, filed on Jan. 20, 2017.

FIELD

The disclosure relates to a voltage-controlled oscillator (VCO), and more particularly to a VCO with enhanced output power.

BACKGROUND

A voltage-controlled oscillator (VCO) is an electronic oscillator with an oscillation frequency controlled by a voltage applied thereto, and may be used in a television remote controller, a car control chip, a home electronic lock, a fingerprint identification device or the like. The VCO conventionally has relatively low output power.

SUMMARY

Therefore, an object of the disclosure is to provide a voltage-controlled oscillator (VCO) that has enhanced output power in comparison with the prior art.

According to the disclosure, the VCO includes an oscillation generator, a first inductor, a second inductor, a first amplifier and a second amplifier. The oscillation generator is used to receive a control voltage, and generates, based on the control voltage, a differential oscillation voltage signal pair that includes a first oscillation voltage signal and a second oscillation voltage signal, and that has an oscillation frequency which varies according to the control voltage. The first inductor has a first terminal that is coupled to the oscillation generator for receiving the first oscillation voltage signal therefrom, and a second terminal that provides a first input voltage signal. The second inductor has a first terminal that is coupled to the oscillation generator for receiving the second oscillation voltage signal therefrom, and a second terminal that provides a second input voltage signal. The first amplifier is coupled to the second terminal of the first inductor for receiving the first input voltage signal therefrom. The second amplifier is coupled to the second terminal of the second inductor for receiving the second input voltage signal therefrom, and is coupled further to the first amplifier. The first amplifier generates, based on the first input voltage signal, a first current signal that has a magnitude which varies according to a magnitude of the first input voltage signal during a half of each period of the differential oscillation voltage signal pair, and which is constant during the other half of each period of the differential oscillation voltage signal pair. The second amplifier generates, based on the second input voltage signal, a second current signal that has a magnitude which is constant during said half of each period of the differential oscillation voltage signal pair, and which varies according to a magnitude of the second input voltage signal during said other half of each period of the differential oscillation voltage signal pair. The first and second current signals are combined into an output current signal at a common node of the first and second amplifiers.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
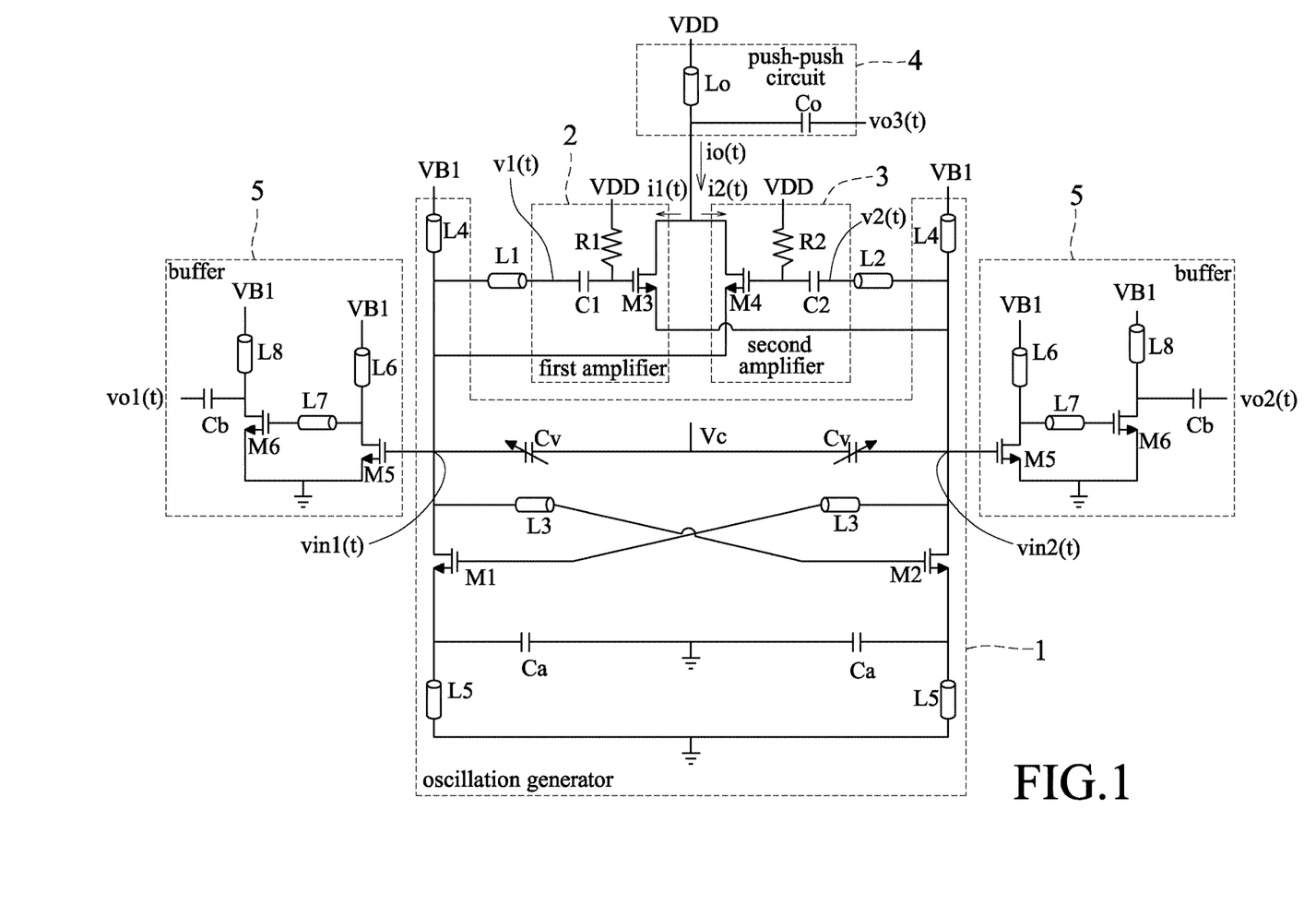
FIG. 1 is a circuit diagram illustrating a first embodiment of a voltage-controlled oscillator (VCO) according to the disclosure.

Referring to FIG. 1, a first embodiment of a voltage-controlled oscillator (VCO) according to the disclosure includes an oscillation generator 1, two buffers 5, a first inductor (L1), a second inductor (L2), a first amplifier 2, a second amplifier 3 and a push-push circuit 4.

The oscillation generator 1 is used to receive a control voltage (Vc), and generates, based on the control voltage (Vc), a differential oscillation voltage signal pair that includes a first oscillation voltage signal (vin1($t$)) and a second oscillation voltage signal (vin2($t$)), and that has a first oscillation frequency of f0 which varies according to the control voltage (Vc).

In this embodiment, the oscillation generator 1 includes two transistors (M1, M2), six inductors (L3-L5), two varactors (Cv) and two capacitors (Ca). The transistor (M1) (e.g., an N-type metal oxide semiconductor field effect transistor (nMOSFET)) has a first terminal (e.g., a drain terminal) that provides the first oscillation voltage signal (vin1($t$)), a second terminal (e.g., a source terminal) and a control terminal (e.g., a gate terminal). The transistor (M2) (e.g., an nMOSFET) has a first terminal (e.g., a drain terminal) that provides the second oscillation voltage signal (vin2($t$)), a second terminal (e.g., a source terminal) and a control terminal (e.g., a gate terminal). One of the inductors (L3) is coupled between the first terminal of the transistor (M1) and the control terminal of the transistor (M2). The other of the inductors (L3) is coupled between the first terminal of the transistor (M2) and the control terminal of the transistor (M1). Each inductor (L4) has a first terminal that is used to receive a supply voltage (VB1) (e.g., 0.5V), and a second terminal that is coupled to the first terminal of a respective transistor (M1, M2). Each varactor (Cv) has a first terminal that is used to receive the control voltage (Vc), and a second terminal that is coupled to the first terminal of a respective transistor (M1, M2). Each varactor (Cv) has a capacitance that varies according to the control voltage (Vc). Each capacitor (Ca) is coupled between the second terminal of a respective transistor (M1, M2) and ground. Each inductor (L5) is coupled between the second terminal of a respective transistor (M1, M2) and ground. The control voltage (Vc)

may be adjusted to change the capacitances of the varactors (Cv), thereby adjusting the first oscillation frequency of f0.

Each buffer 5 is coupled to the first terminal of a respective transistor (M1, M2) for receiving a respective one of the first and second oscillation voltage signals (vin1(*t*), vin2(*t*)) therefrom. Each buffer 5 buffers the respective one of the first and second oscillation voltage signals (vin1(*t*), vin2(*t*)) to generate a respective one of a first output voltage signal (vo1(*t*)) and a second output voltage signal (vo2(*t*)) that cooperatively constitute a differential output signal pair with the first oscillation frequency of f0.

In this embodiment, each buffer 5 includes two transistors (M5, M6), three inductors (L6-L8) and a capacitor (Cb). The transistor (M5) (e.g., an nMOSFET) has a first terminal (e.g., a drain terminal), a second terminal (e.g., a source terminal) that is grounded, and a control terminal (e.g., a gate terminal) that is coupled to the first terminal of the respective transistor (M1, M2) for receiving the respective one of the first and second oscillation voltage signals (vin1(*t*), vin2(*t*)) therefrom. The inductor (L6) has a first terminal that is used to receive the supply voltage (VB1), and a second terminal that is coupled to the first terminal of the transistor (M5). The inductor (L7) has a first terminal that is coupled to the first terminal of the transistor (M5), and a second terminal. The transistor (M6) (e.g., an nMOSFET) has a first terminal (e.g., a drain terminal), a second terminal (e.g., a source terminal) that is grounded, and a control terminal (e.g., a gate terminal) that is coupled to the second terminal of the inductor (L7). The inductor (L8) is coupled between the first terminal of the inductor (L6) and the first terminal of the transistor (M6). The capacitor (Cb) has a first terminal that is coupled to the first terminal of the transistor (M6), and a second terminal that provides the respective one of the first and second output voltage signals (vo1(*t*), vo2(*t*)).

The first inductor (L1) has a first terminal that is coupled to the first terminal of the transistor (M1) for receiving the first oscillation voltage signal (vin1(*t*)) therefrom, and a second terminal that provides a first input voltage signal (v1(*t*)).

The second inductor (L2) has a first terminal that is coupled to the first terminal of the transistor (M2) for receiving the second oscillation voltage signal (vin2(*t*)) therefrom, and a second terminal that provides a second input voltage signal (v2(*t*)).

The first amplifier 2 is coupled to the second terminal of the first inductor (L1) for receiving the first input voltage signal (v1(*t*)) therefrom, and generates a first current signal (i1(*t*)) based on the first input voltage signal (v1(*t*)).

The second amplifier 3 is coupled to the second terminal of the second inductor (L2) for receiving the second input voltage signal (v2(*t*)) therefrom, and generates a second current signal (i2(*t*)) based on the second input voltage signal (v2(*t*)). The second amplifier 3 is coupled further to the first amplifier 2, and the first and second current signals (i1(*t*), i2(*t*)) are combined into an output current signal (io(t)) at a common node of the first and second amplifiers 2, 3.

In this embodiment, the first amplifier 2 includes a capacitor (C1), a resistor (R1) and a transistor (M3). The capacitor (C1) has a first terminal that is coupled to the second terminal of the first inductor (L1) for receiving the first input voltage signal (v1(*t*)) therefrom, and a second terminal. The resistor (R1) has a first terminal that is used to receive a supply voltage (VDD) (e.g., 1V), and a second terminal that is coupled to the second terminal of the capacitor (C1). The transistor (M3) (e.g., an nMOSFET) has a first terminal (e.g., a drain terminal) that provides the first current signal (i1(*t*)), a second terminal (e.g., a source terminal) that is coupled to the first terminal of the transistor (M2) for receiving the second oscillation voltage signal (vin2(*t*)) therefrom, and a control terminal (e.g., a gate terminal) that is coupled to the second terminal of the capacitor (C1).

In this embodiment, the second amplifier 3 includes a capacitor (C2), a resistor (R2) and a transistor (M4). The capacitor (C2) has a first terminal that is coupled to the second terminal of the second inductor (L2) for receiving the second input voltage signal (v2(*t*)) therefrom, and a second terminal. The resistor (R2) has a first terminal that is used to receive the supply voltage (VDD), and a second terminal that is coupled to the second terminal of the capacitor (C2). The transistor (M4) (e.g., an nMOSFET) has a first terminal (e.g., a drain terminal) that is coupled to the first terminal of the transistor (M3) and that provides the second current signal (i2(*t*)), a second terminal (e.g., a source terminal) that is coupled to the first terminal of the transistor (M1) for receiving the first oscillation voltage signal (vin1(*t*)) therefrom, and a control terminal (e.g., agate terminal) that is coupled to the second terminal of the capacitor (C2). The transistor (M4) has the same dimensions as the transistor (M3).

The push-push circuit 4 is coupled to the first terminal of the transistor (M3) for receiving the output current signal (io(t)) therefrom, and performs, on the output current signal (io(t)), current-to-voltage conversion and attenuation in frequencies that are outside a frequency band to generate a third output voltage signal (vo3(*t*)). The frequency band contains a second oscillation frequency that is twice the first oscillation frequency (i.e., the second oscillation frequency equals 2×f0).

In this embodiment, the push-push circuit 4 includes a transmission line inductor (Lo) and a capacitor (Co). The transmission line inductor (Lo) has a first terminal that is used to receive the supply voltage (VDD), and a second terminal that is coupled to the first terminal of the transistor (M3) for receiving the output current signal (io(t)) therefrom. The transmission line inductor (Lo) has a length that substantially equals a quarter of a wavelength which corresponds to the second oscillation frequency of 2×f0 (i.e., $[(3\times10^8)/(2\times f0)]\times(\frac{1}{4})$ in meters). The capacitor (Co) has a first terminal that is coupled to the second terminal of the transmission line inductor (Lo), and a second terminal that provides the third output voltage signal (vo3(*t*)).

Figure 2:
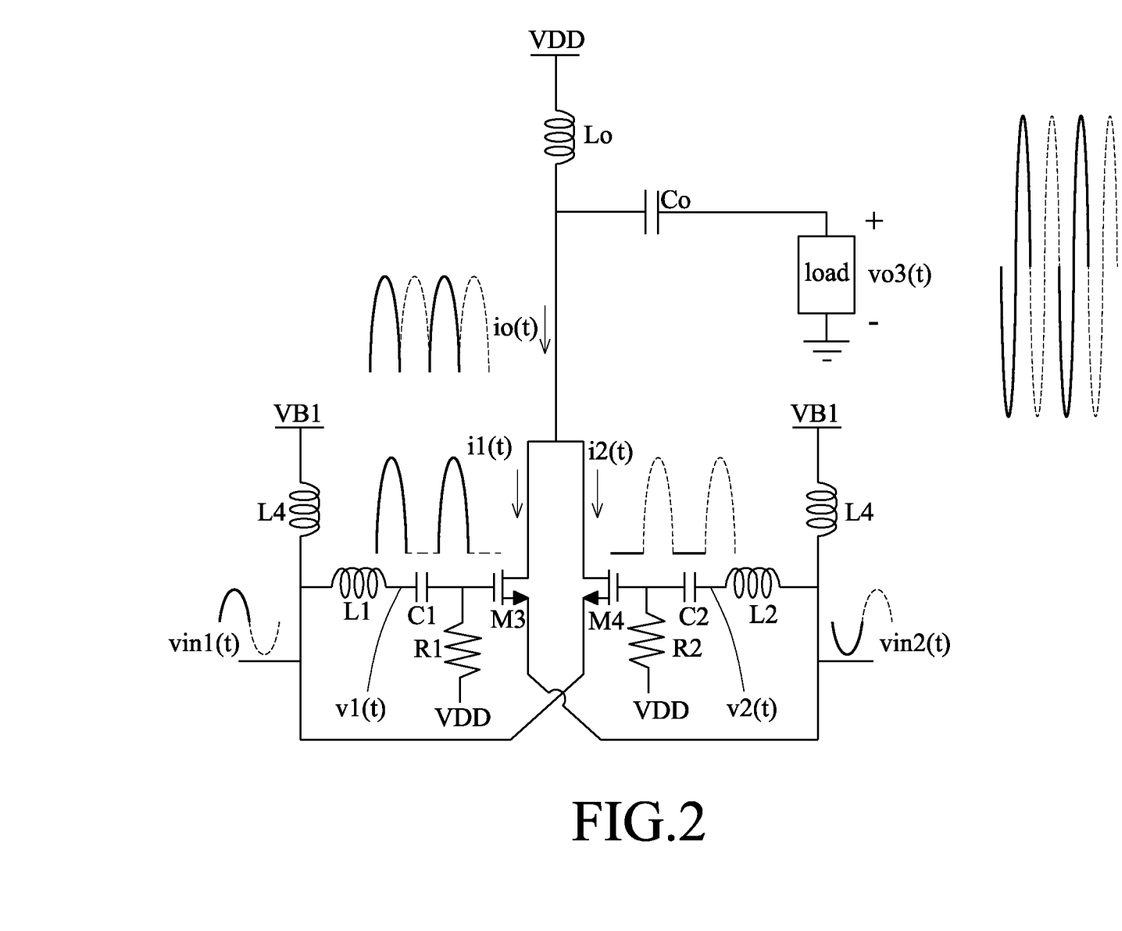
FIG. 2 is a plot illustrating operation of the first embodiment.

Referring to FIG. 2, during a half of each period of the differential oscillation voltage signal pair where the first oscillation voltage signal (vin1(*t*)) is greater than the second oscillation voltage signal (vin2(*t*)) in magnitude, the first current signal (i1(*t*)) has a magnitude that varies according to a magnitude of the first input voltage signal (v1(*t*)), and the second current signal (i2(*t*)) has a magnitude that is constant (e.g., zero), so the output current signal (io(t)) has a magnitude that varies according to the magnitude of the first input voltage signal (v1(*t*)). During the other half of each period of the differential oscillation voltage signal pair where the first oscillation voltage signal (vin1(*t*)) is less than the second oscillation voltage signal (vin2(*t*)) in magnitude, the magnitude of the first current signal (i1(*t*)) is constant (e.g., zero), and the magnitude of the second current signal (i2(*t*)) varies according to a magnitude of the second input voltage signal (v2(*t*)), so the magnitude of the output current signal (io(t)) varies according to the magnitude of the second input voltage signal (v2(*t*)). As a result, the output current signal (io(t)) has frequencies of f0, 2×f0, 3×f0, 4×f0, etc. By virtue of the push-push circuit 4, the third output voltage signal (vo3(*t*)) only has the second oscillation frequency of 2×f0.

It should be noted that each capacitor (C1, C2) is used for alternating current (AC) coupling and direct current (DC) blocking, and that each resistor (R1, R2) is used for DC biasing. Each capacitor (C1, C2) has a substantially zero impedance around the first oscillation frequency of f0, and may be neglected in small signal analysis. The supply voltage (VDD) is set such that each transistor (M3, M4) may operate in a saturation region.

Figure 3:
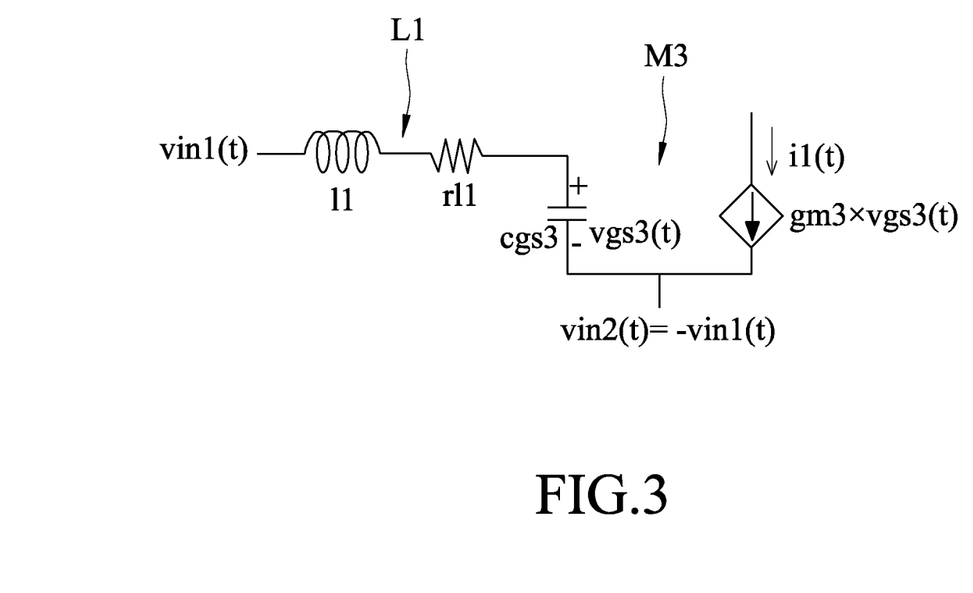
FIG. 3 is a circuit diagram illustrating a small signal equivalent circuit of a combination of a first inductor and a first amplifier of the first embodiment.

A small signal equivalent circuit of a combination of the first inductor (L1) and the first amplifier 2 is depicted in FIG. 3. Referring to FIGS. 1 and 3, during said half of each period of the differential oscillation voltage signal pair, the first current signal (i1(t)) can be expressed by the following equation:

$$i1(t) = gm3 \cdot vgs3(t) = \frac{gm3 \cdot [vin1(t) - vin2(t)]}{1 - \omega^2 \cdot l1 \cdot cgs3 + j\omega \cdot rl1 \cdot cgs3}$$
$$= \frac{gm3 \cdot 2 \cdot vin1(t)}{1 - \omega^2 \cdot l1 \cdot cgs3 + j\omega \cdot rl1 \cdot cgs3},$$

and the combination of the first inductor (L1) and the first amplifier 2 has a gain (i1(t)/vin1(t)) that can be expressed by the following equation:

$$\frac{i1(t)}{vin1(t)} = \frac{2 \cdot gm3}{1 - \omega^2 \cdot l1 \cdot cgs3 + j\omega \cdot rl1 \cdot cgs3}, \qquad \text{Equation 1}$$

where gm3 denotes a transconductance of the transistor (M3), vgs3(t) denotes a voltage provided between the control and second terminals of the transistor (M3), cgs3 denotes a parasitic capacitance provided between the control and second terminals of the transistor (M3), l1 denotes an inductance of the first inductor (L1), rl1 denotes a parasitic resistance of the first inductor (L1), and ω denotes an angular frequency that corresponds to the first oscillation frequency of f0 (i.e., ω=2π·f0). It is known from Equation 1 that the first inductor (L1) can enhance the gain of the combination of the first inductor (L1) and the first amplifier 2, and that greater inductance of the first inductor (L1) leads to a higher gain of the combination of the first inductor (L1) and the first amplifier 2. It is also known from Equation 1 that the receipt of the second oscillation voltage signal (vin2(t)) by the transistor (M3) at the second terminal thereof can enhance the gain of the combination of the first inductor (L1) and the first amplifier 2 by two times. Similarly, during said other half of each period of the differential oscillation voltage signal pair, the second inductor (L2) and the receipt of the first oscillation voltage signal (vin1(t)) by the transistor (M4) at the second terminal thereof can enhance a gain (i2(t)/vin2(t)) of a combination of the second inductor (L2) and the second amplifier 3. As a result, a magnitude of the third output voltage signal (vo3(t)) and output power of the VCO of this embodiment are increased as well.

Figure 4:
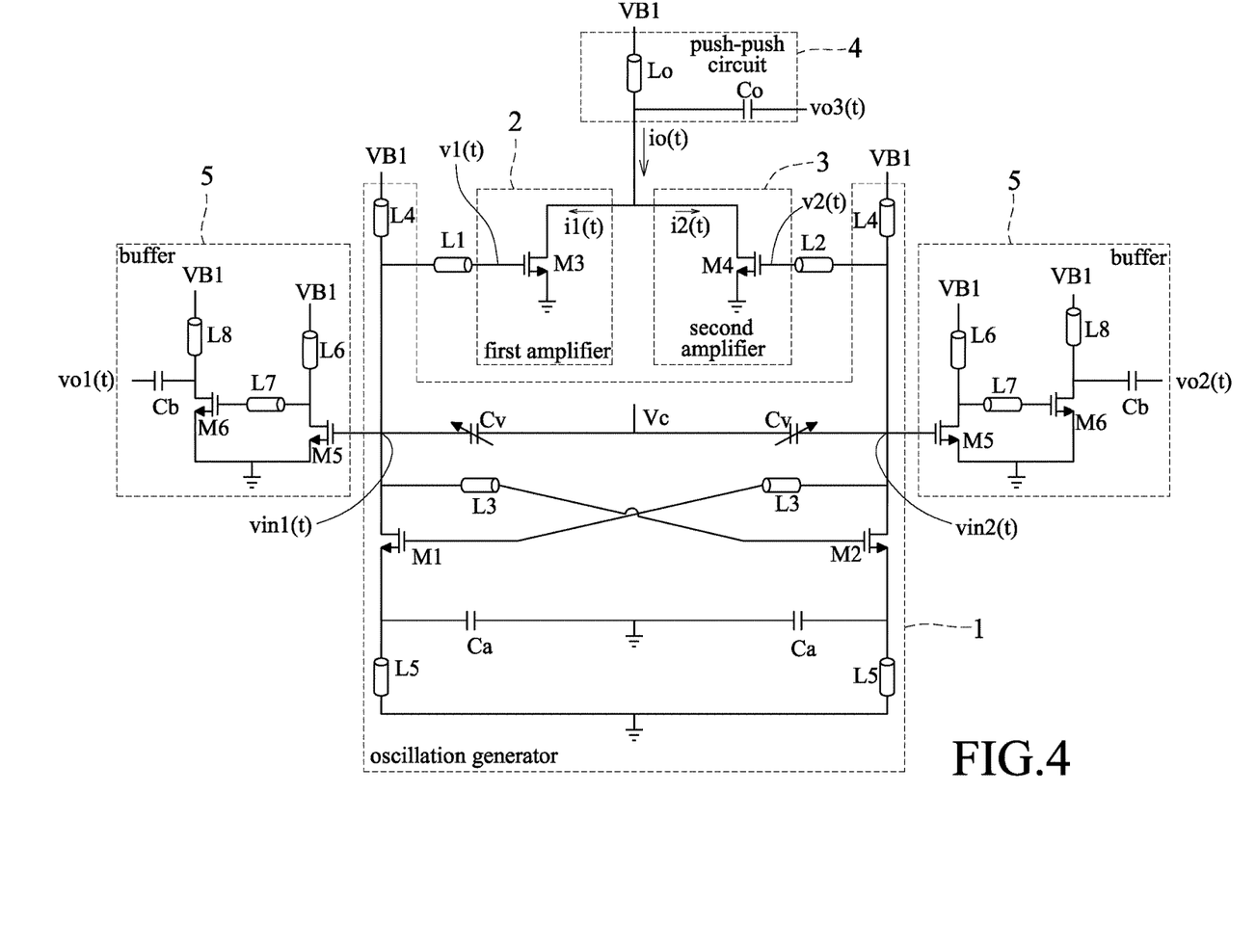
FIG. 4 is a circuit diagram illustrating a second embodiment of the VCO according to the disclosure.

Referring to FIG. 4, a second embodiment of the VCO according to the disclosure is a modification of the first embodiment, and differs from the first embodiment in that the first amplifier 2 does not include the capacitor (C1) (see FIG. 1) and the resistor (R1) (see FIG. 2), that the second amplifier 3 does not include the capacitor (C2) (see FIG. 1) and the resistor (R2) (see FIG. 2), and that the supply voltage (VDD) (see FIG. 1) is replaced by the supply voltage (VB1).

In the second embodiment, the second terminal of each transistor (M3, M4) is grounded. The control terminal of the transistor (M3) is coupled to the second terminal of the first inductor (L1) for receiving the first input voltage signal (v1(t)) therefrom. The control terminal of the transistor (M4) is coupled to the second terminal of the second inductor (L2) for receiving the second input voltage signal (v2(t)) therefrom.

Figure 5:
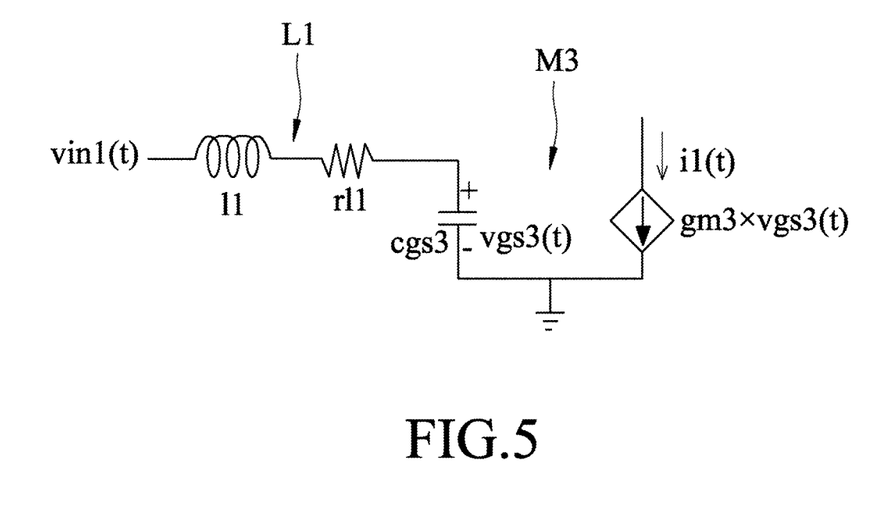
FIG. 5 is a circuit diagram illustrating a small signal equivalent circuit of the combination of the first inductor and the first amplifier of the second embodiment.

Referring to FIGS. 4 and 5, a small signal equivalent circuit of the combination of the first inductor (L1) and the first amplifier 2 is depicted in FIG. 5. During said half of each period of the differential oscillation voltage signal pair, the first current signal (i1(t)) can be expressed by the following equation:

$$i1(t) = gm3 \cdot vgs3(t) = \frac{gm3 \cdot vin1(t)}{1 - \omega^2 \cdot l1 \cdot cgs3 + j\omega \cdot rl1 \cdot cgs3},$$

and the gain of the combination of the first inductor (L1) and the first amplifier 2 can be expressed by the following equation:

$$\frac{i1(t)}{vin1(t)} = \frac{gm3}{1 - \omega^2 \cdot l1 \cdot cgs3 + j\omega \cdot rl1 \cdot cgs3}. \qquad \text{Equation 2}$$

It is known from Equation 2 that the first inductor (L1) can enhance the gain of the combination of the first inductor (L1) and the first amplifier 2, and that greater inductance of the first inductor (L1) leads to a higher gain of the combination of the first inductor (L1) and the first amplifier 2. Similarly, during said other half of each period of the differential oscillation voltage signal pair, the second inductor (L2) can enhance the gain of the combination of the second inductor (L2) and the second amplifier 3. As a result, the magnitude of the third output voltage signal (vo3(t)) and the output power of the VCO of this embodiment are increased as well.

Figure 6:
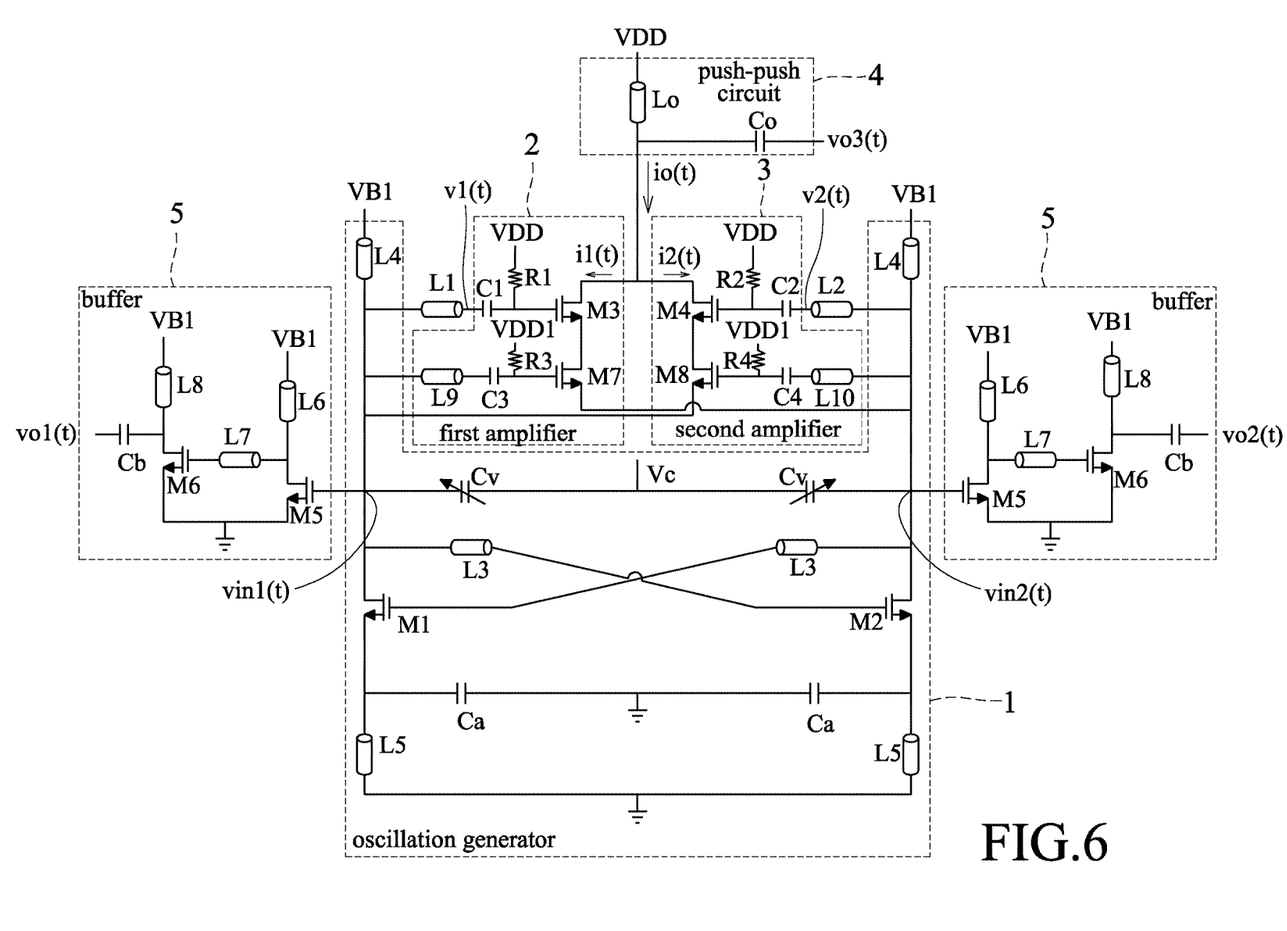
FIG. 6 is a circuit diagram illustrating a third embodiment of the VCO according to the disclosure.

Referring to FIG. 6, a third embodiment of the VCO according to the disclosure is a modification of the first embodiment, and differs from the first embodiment in that the first amplifier 2 further includes an inductor (L9), a capacitor (C3), a resistor (R3) and a transistor (M7), that the second amplifier 3 further includes an inductor (L10), a capacitor (C4), a resistor (R4) and a transistor (M8), and that the supply voltage (VDD) is, for example, 1.5V.

In the third embodiment, the second terminal of the transistor (M3) is not coupled to the first terminal of the transistor (M2). The inductor (L9) has a first terminal that is coupled to the first terminal of the transistor (M1) for receiving the first oscillation voltage signal (vin1(t)) therefrom, and a second terminal. The capacitor (C3) has a first terminal that is coupled to the second terminal of the inductor (L9), and a second terminal. The resistor (R3) has a first terminal that is used to receive a supply voltage (VDD1) (e.g., 1V), and a second terminal that is coupled to the second terminal of the capacitor (C3). The transistor (M7) (e.g., an nMOSFET) has a first terminal (e.g., a drain terminal) that is coupled to the second terminal of the transistor (M3), a second terminal (e.g., a source terminal) that is coupled to the first terminal of the transistor (M2) for receiving the second oscillation voltage signal (vin2(t)) therefrom, and a control terminal (e.g., a gate terminal) that is coupled to the second terminal of the capacitor (C3).

Moreover, the second terminal of the transistor (M4) is not coupled to the first terminal of the transistor (M1). The inductor (L10) has a first terminal that is coupled to the first terminal of the transistor (M2) for receiving the second oscillation voltage signal (vin2(t)) therefrom, and a second terminal. The capacitor (C4) has a first terminal that is coupled to the second terminal of the inductor (L10), and a second terminal. The resistor (R4) has a first terminal that is used to receive the supply voltage (VDD1), and a second terminal that is coupled to the second terminal of the capacitor (C4). The transistor (M8) (e.g., an nMOSFET) has a first terminal (e.g., a drain terminal) that is coupled to the second terminal of the transistor (M4), a second terminal (e.g., a source terminal) that is coupled to the first terminal of the transistor (M1) for receiving the first oscillation voltage signal (vin1(t)) therefrom, and a control terminal (e.g., a gate terminal) that is coupled to the second terminal of the capacitor (C4). The transistor (M8) has the same dimensions as the transistor (M7).

It should be noted that each capacitor (C3, C4) is used for AC coupling and DC blocking, and that each resistor (R3, R4) is used for DC biasing. Each capacitor (C3, C4) has a substantially zero impedance around the first oscillation frequency of f0, and may be neglected in small signal analysis. The supply voltage (VDD1) is set such that each transistor (M7, M8) may operate in a saturation region.

During said half of each period of the differential oscillation voltage signal pair, a voltage (vs3(t)) provided at the second terminal of the transistor (M3) can be expressed by the following equation:

$$vs3(t) = -gm7 \cdot vgs7(t) \cdot \left(\frac{1}{gm3} // ro3 // ro7\right) \approx -vgs7(t) \approx -G \cdot vin1(t),$$

where gm7 denotes a transconductance of the transistor (M7), vgs7(t) denotes a voltage provided between the control and second terminals of the transistor (M7), ro7 denotes an output resistance provided between the first and second terminals of the transistor (M7), ro3 denotes an output resistance provided between the first and second terminals of the transistor (M3), $$G = \frac{2}{1 - \omega^2 \cdot l9 \cdot cgs7 + j\omega \cdot rl9 \cdot cgs7},$$

l9 denotes an inductance of the inductor (L9), rl9 denotes a parasitic resistance of the inductor (L9), and cgs7 denotes a parasitic capacitance provided between the control and second terminals of the transistor (M7). The parasitic resistance (rl9) is very small, so (jω·rl9·cgs7) is substantially zero. To prevent instability of the VCO of this embodiment, the inductance (l9) is set such that (ω²·l9·cgs7) is within a range of, for example, 0.67 to 0.8, making (G) fall substantially within a range of six to ten.

During said half of each period of the differential oscillation voltage signal pair, the first current signal (i1(t)) can be expressed by the following equation:

$$i1(t) = gm3 \cdot vgs3(t) = \frac{gm3 \cdot (G+1) \cdot vin1(t)}{1 - \omega^2 \cdot l1 \cdot cgs3 + j\omega \cdot rl1 \cdot cgs3},$$

and the gain of the combination of the first inductor (L1) and the first amplifier 2 can be expressed by the following equation:

$$\frac{i1(t)}{vin1(t)} = \frac{(G+1) \cdot gm3}{1 - \omega^2 \cdot l1 \cdot cgs3 + j\omega \cdot rl1 \cdot cgs3}. \qquad \text{Equation 3}$$

It is known from Equation 3 that the first inductor (L1) can enhance the gain of the combination of the first inductor (L1) and the first amplifier 2, and that greater inductance of the first inductor (L1) leads to a higher gain of the combination of the first inductor (L1) and the first amplifier 2. It is also known from Equation 3 that the transistor (M7) and the receipt of the second oscillation voltage signal (vin2(t)) by the transistor (M7) at the second terminal thereof can enhance the gain of the combination of the first inductor (L1) and the first amplifier 2 by (G+1) times (i.e., seven to eleven times). Similarly, during said other half of each period of the differential oscillation voltage signal pair, the second inductor (L2), the transistor (M8) and the receipt of the first oscillation voltage signal (vin1(t)) by the transistor (M8) at the second terminal thereof can enhance the gain of the combination of the second inductor (L2) and the second amplifier 3. As a result, the magnitude of the third output voltage signal (vo3(t)) and the output power of the VCO of this embodiment are increased as well.

Figure 7:
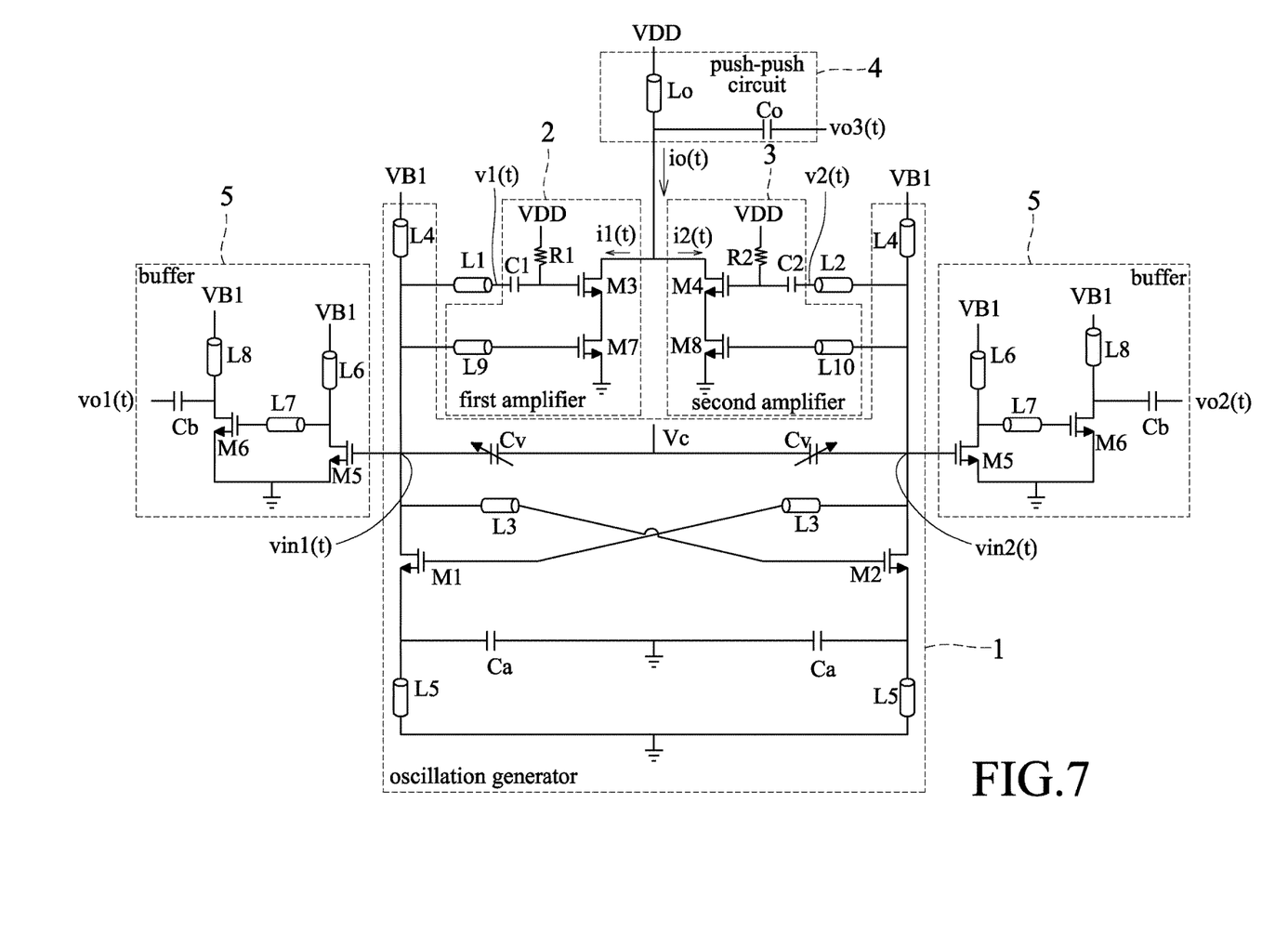
FIG. 7 is a circuit diagram illustrating a fourth embodiment of the VCO according to the disclosure.

Referring to FIG. 7, a fourth embodiment of the VCO according to the disclosure is a modification of the third embodiment, and differs from the third embodiment in that the first amplifier 2 does not include the capacitor (C3) (see FIG. 6) and the resistor (R3) (see FIG. 6), that the second amplifier 3 does not include the capacitor (C4) (see FIG. 6) and the resistor (R4) (see FIG. 6), and that the supply voltage (VDD) is, for example, 1V.

In the fourth embodiment, the second terminal of each transistor (M7, M8) is grounded. The control terminal of the transistor (M7) is coupled to the second terminal of the inductor (L9). The control terminal of the transistor (M8) is coupled to the second terminal of the inductor (L10).

During said half of each period of the differential oscillation voltage signal pair, the voltage (vs3(t)) provided at the second terminal of the transistor (M3) can be expressed by the following equation:

$$vs3(t) = -gm7 \cdot vgs7(t) \cdot \left(\frac{1}{gm3} // ro3 // ro7\right) \approx -vgs7(t) \approx -G \cdot vin1(t),$$

where $$G = \frac{1}{1 - \omega^2 \cdot l9 \cdot cgs7 + j\omega \cdot rl9 \cdot cgs7}.$$

To prevent the instability of the VCO of this embodiment, the inductance (l9) is set such that (ω²·l9·cgs7) is within a range of, for example, 0.67 to 0.8, making (G) fall substantially within a range of three to five.

During said half of each period of the differential oscillation voltage signal pair, the first current signal ($i1(t)$) can be expressed by the following equation:

$$i1(t) = gm3 \cdot vgs3(t) = \frac{gm3 \cdot (G+1) \cdot vin1(t)}{1 - \omega^2 \cdot l1 \cdot cgs3 + j\omega \cdot rl1 \cdot cgs3},$$

and the gain of the combination of the first inductor (L1) and the first amplifier 2 can be expressed by the following equation:

$$\frac{i1(t)}{vin1(t)} = \frac{(G+1) \cdot gm3}{1 - \omega^2 \cdot l1 \cdot cgs3 + j\omega \cdot rl1 \cdot cgs3}. \quad \text{Equation 4}$$

It is known from Equation 4 that the first inductor (L1) can enhance the gain of the combination of the first inductor (L1) and the first amplifier 2, and that greater inductance of the first inductor (L1) leads to a higher gain of the combination of the first inductor (L1) and the first amplifier 2. It is also known from Equation 4 that the transistor (M7) can enhance the gain of the combination of the first inductor (L1) and the first amplifier 2 by (G+1) times (i.e., four to six times). Similarly, during said other half of each period of the differential oscillation voltage signal pair, the second inductor (L2) and the transistor (M8) can enhance the gain of the combination of the second inductor (L2) and the second amplifier 3. As a result, the magnitude of the third output voltage signal ($vo3(t)$) and the output power of the VCO of this embodiment are increased as well.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that the disclosure is not limited to the disclosed embodiment(s) but is intended to cover various arrangements included within the spirit and scope of the broadest interpretation so as to encompass all such modifications and equivalent arrangements.

What is claimed is:

1. A voltage-controlled oscillator (VCO) comprising:
   an oscillation generator used to receive a control voltage, and generating, based on the control voltage, a differential oscillation voltage signal pair that includes a first oscillation voltage signal and a second oscillation voltage signal, and that has a first oscillation frequency which varies according to the control voltage;
   a first inductor having a first terminal that is coupled to said oscillation generator for receiving the first oscillation voltage signal therefrom, and a second terminal that provides a first input voltage signal;
   a second inductor having a first terminal that is coupled to said oscillation generator for receiving the second oscillation voltage signal therefrom, and a second terminal that provides a second input voltage signal;
   a first amplifier coupled to said second terminal of said first inductor for receiving the first input voltage signal therefrom; and
   a second amplifier coupled to said second terminal of said second inductor for receiving the second input voltage signal therefrom, and coupled further to said first amplifier;
   said first amplifier generating, based on the first input voltage signal, a first current signal that has a magnitude which varies according to a magnitude of the first input voltage signal during a half of each period of the differential oscillation voltage signal pair, and which is constant during the other half of each period of the differential oscillation voltage signal pair;
   said second amplifier generating, based on the second input voltage signal, a second current signal that has a magnitude which is constant during said half of each period of the differential oscillation voltage signal pair, and which varies according to a magnitude of the second input voltage signal during said other half of each period of the differential oscillation voltage signal pair;
   the first and second current signals being combined into an output current signal at a common node of said first and second amplifiers.

2. The VCO of claim 1, wherein said oscillation generator includes:
   a first transistor having a first terminal that provides the first oscillation voltage signal, a second terminal and a control terminal;
   a second transistor having a first terminal that provides the second oscillation voltage signal, a second terminal and a control terminal;
   two third inductors, one of which is coupled between said first terminal of said first transistor and said control terminal of said second transistor, and the other of which is coupled between said first terminal of said second transistor and said control terminal of said first transistor;
   two fourth inductors, each having a first terminal that is used to receive a supply voltage, and a second terminal that is coupled to said first terminal of a respective one of said first and second transistors; and
   two varactors, each having a first terminal that is used to receive the control voltage, a second terminal that is coupled to said first terminal of a respective one of said first and second transistors, and a capacitance that varies according to the control voltage.

3. The VCO of claim 2, wherein said oscillation generator further includes:
   two capacitors, each coupled between said second terminal of a respective one of said first and second transistors and ground; and
   two fifth inductors, each coupled between said second terminal of a respective one of said first and second transistors and ground.

4. The VCO of claim 1, wherein:
   said first amplifier includes a first transistor having a first terminal that provides the first current signal, a second terminal that is grounded, and a control terminal that is coupled to said second terminal of said first inductor for receiving the first input voltage signal therefrom; and said second amplifier includes a second transistor having a first terminal that is coupled to said first terminal of said first transistor and that provides the second current signal, a second terminal that is grounded, and a control terminal that is coupled to said second terminal of said second inductor for receiving the second input voltage signal therefrom.

5. The VCO of claim 1, wherein:
said first amplifier includes
 a first capacitor having a first terminal that is coupled to said second terminal of said first inductor for receiving the first input voltage signal therefrom, and a second terminal,
 a first resistor having a first terminal that is used to receive a supply voltage, and a second terminal that is coupled to said second terminal of said first capacitor, and
 a first transistor having a first terminal that provides the first current signal, a second terminal that is coupled to said oscillation generator for receiving the second oscillation voltage signal therefrom, and a control terminal that is coupled to said second terminal of said first capacitor; and
said second amplifier includes
 a second capacitor having a first terminal that is coupled to said second terminal of said second inductor for receiving the second input voltage signal therefrom, and a second terminal,
 a second resistor having a first terminal that is used to receive the supply voltage, and a second terminal that is coupled to said second terminal of said second capacitor, and
 a second transistor having a first terminal that is coupled to said first terminal of said first transistor and that provides the second current signal, a second terminal that is coupled to said oscillation generator for receiving the first oscillation voltage signal therefrom, and a control terminal that is coupled to said second terminal of said second capacitor.

6. The VCO of claim 1, further comprising a push-push circuit that is coupled to said common node of said first and second amplifiers for receiving the output current signal therefrom, and that performs, on the output current signal, current-to-voltage conversion and attenuation in frequencies which are outside a frequency band to generate an output voltage signal, the frequency band containing a second oscillation frequency that is twice the first oscillation frequency.

7. The VCO of claim 6, wherein said push-push circuit includes:
 a transmission line inductor having a first terminal that is used to receive a supply voltage, a second terminal that is coupled to said common node of said first and second amplifiers for receiving the output current signal therefrom, and a length that substantially equals a quarter of a wavelength which corresponds to the second oscillation frequency; and
 a capacitor having a first terminal that is coupled to said second terminal of said transmission line inductor, and a second terminal that provides the output voltage signal.

8. The VCO of claim 1, further comprising two buffers, each of which is coupled to said oscillation generator for receiving a respective one of the first and second oscillation voltage signals therefrom, and each of which buffers said respective one of the first and second oscillation voltage signals to generate a respective one of a first output voltage signal and a second output voltage signal.

9. The VCO of claim 8, wherein each of said buffers includes:
 a first transistor having a first terminal, a second terminal that is grounded, and a control terminal that is coupled to said oscillation generator for receiving said respective one of the first and second oscillation voltage signals therefrom;
 a third inductor having a first terminal that is used to receive a supply voltage, and a second terminal that is coupled to said first terminal of said first transistor;
 a fourth inductor having a first terminal that is coupled to said first terminal of said first transistor, and a second terminal;
 a second transistor having a first terminal, a second terminal that is grounded, and a control terminal that is coupled to said second terminal of said fourth inductor;
 a fifth inductor coupled between said first terminal of said third inductor and said first terminal of said second transistor; and
 a capacitor having a first terminal that is coupled to said first terminal of said second transistor, and a second terminal that provides said respective one of the first and second output voltage signals.

10. The VCO of claim 1, wherein:
said first amplifier includes
 a first capacitor having a first terminal that is coupled to said second terminal of said first inductor for receiving the first input voltage signal therefrom, and a second terminal,
 a first resistor having a first terminal that is used to receive a first supply voltage, and a second terminal that is coupled to said second terminal of said first capacitor,
 a first transistor having a first terminal that provides the first current signal, a second terminal, and a control terminal that is coupled to said second terminal of said first capacitor,
 a third inductor having a first terminal that is coupled to said oscillation generator for receiving the first oscillation voltage signal therefrom, and a second terminal,
 a second capacitor having a first terminal that is coupled to said second terminal of said third inductor, and a second terminal,
 a second resistor having a first terminal that is used to receive a second supply voltage, and a second terminal that is coupled to said second terminal of said second capacitor, and
 a second transistor having a first terminal that is coupled to said second terminal of said first transistor, a second terminal that is coupled to said oscillation generator for receiving the second oscillation voltage signal therefrom, and a control terminal that is coupled to said second terminal of said second capacitor; and
said second amplifier includes
 a third capacitor having a first terminal that is coupled to said second terminal of said second inductor for receiving the second input voltage signal therefrom, and a second terminal,
 a third resistor having a first terminal that is used to receive the first supply voltage, and a second terminal that is coupled to said second terminal of said third capacitor, a third transistor having a first terminal that is coupled to said first terminal of said first transistor and that provides the second current signal, a second terminal, and a control terminal that is coupled to said second terminal of said third capacitor, a fourth inductor having a first terminal that is coupled to said oscillation generator for receiving the second oscillation voltage signal therefrom, and a second terminal, a fourth capacitor having a first terminal that is coupled to said second terminal of said fourth inductor, and a second terminal, a fourth resistor having a first terminal that is used to receive the second supply voltage, and a second terminal that is coupled to said second terminal of said fourth capacitor, and a fourth transistor having a first terminal that is coupled to said second terminal of said third transistor, a second terminal that is coupled to said oscillation generator for receiving the first oscillation voltage signal therefrom, and a control terminal that is coupled to said second terminal of said fourth capacitor.

11. The VCO of claim 1, wherein:

said first amplifier includes a first capacitor having a first terminal that is coupled to said second terminal of said first inductor for receiving the first input voltage signal therefrom, and a second terminal, a first resistor having a first terminal that is used to receive a supply voltage, and a second terminal that is coupled to said second terminal of said first capacitor, a first transistor having a first terminal that provides the first current signal, a second terminal, and a control terminal that is coupled to said second terminal of said first capacitor, a third inductor having a first terminal that is coupled to said oscillation generator for receiving the first oscillation voltage signal therefrom, and a second terminal, and a second transistor having a first terminal that is coupled to said second terminal of said first transistor, a second terminal that is grounded, and a control terminal that is coupled to said second terminal of said third inductor; and said second amplifier includes a second capacitor having a first terminal that is coupled to said second terminal of said second inductor for receiving the second input voltage signal therefrom, and a second terminal, a second resistor having a first terminal that is used to receive the supply voltage, and a second terminal that is coupled to said second terminal of said second capacitor, a third transistor having a first terminal that is coupled to said first terminal of said first transistor and that provides the second current signal, a second terminal, and a control terminal that is coupled to said second terminal of said second capacitor, a fourth inductor having a first terminal that is coupled to said oscillation generator for receiving the second oscillation voltage signal therefrom, and a second terminal, and a fourth transistor having a first terminal that is coupled to said second terminal of said third transistor, a second terminal that is grounded, and a control terminal that is coupled to said second terminal of said fourth inductor.

* * * * *